(12) United States Patent
Quinones et al.

(10) Patent No.: US 7,785,667 B2
(45) Date of Patent: Aug. 31, 2010

(54) METHOD OF CONTROLLING EDGE DEFINITION OF VISCOUS MATERIALS

(75) Inventors: Horatio Quinones, Carlsbad, CA (US); Tom Chang, Oceanside, CA (US); Rick Zakrajsek, Lorain, OH (US); George Vastola, Carlsbad, CA (US); Brad Perkins, Carlsbad, CA (US); Pat Hogan, San Marcos, CA (US)

(73) Assignee: Nordson Corporation, Westlake, OH (US)

( * ) Notice: Subject to any disclaimer, the term of this patent is extended or adjusted under 35 U.S.C. 154(b) by 745 days.

(21) Appl. No.: 11/619,871

(22) Filed: Jan. 4, 2007

(65) Prior Publication Data

US 2008/0164335 A1 Jul. 10, 2008

(51) Int. Cl.
*B05B 17/04* (2006.01)
*A62C 5/02* (2006.01)
*B05D 5/00* (2006.01)
*B05D 3/04* (2006.01)
*B05D 3/12* (2006.01)

(52) U.S. Cl. .............. 427/284; 239/7; 239/8; 427/256; 427/348; 427/355; 427/367; 427/356; 427/357

(58) Field of Classification Search .................. 427/284
See application file for complete search history.

(56) References Cited

U.S. PATENT DOCUMENTS

| | | | |
|---|---|---|---|
| 3,916,042 A * | 10/1975 | Grietens | 427/269 |
| 5,320,250 A | 6/1994 | La et al. | |
| 5,505,777 A | 4/1996 | Ciardella et al. | |
| 5,711,989 A | 1/1998 | Ciardella et al. | |
| 5,747,102 A | 5/1998 | Smith et al. | |
| 6,022,583 A | 2/2000 | Falcone et al. | |
| 6,081,281 A * | 6/2000 | Cleary et al. | 347/21 |
| 6,234,379 B1 * | 5/2001 | Donges | 228/207 |
| 6,341,840 B1 * | 1/2002 | van Doorn et al. | 347/41 |
| 2003/0034141 A1 * | 2/2003 | Grinberg et al. | 164/46 |
| 2003/0136817 A1 * | 7/2003 | Stoops | 228/207 |
| 2004/0241586 A1 * | 12/2004 | Hirai et al. | 430/311 |
| 2005/0042381 A1 | 2/2005 | Weiss et al. | |
| 2005/0098534 A1 * | 5/2005 | Sreenivasan et al. | 216/52 |
| 2005/0183661 A1 | 8/2005 | Lee et al. | |
| 2006/0063274 A1 * | 3/2006 | Schremp et al. | 436/180 |

OTHER PUBLICATIONS

European Patent Office, International Search Report and Written Opinion in PCT Application Serial No. PCT/US2007/086490, May 27, 2008, 9 pgs.

* cited by examiner

*Primary Examiner*—Timothy H Meeks
*Assistant Examiner*—Mandy C Louie
(74) *Attorney, Agent, or Firm*—Wood, Herron & Evans, LLP

(57) ABSTRACT

A method of controlling edge definition of viscous material applied to an application area on a substrate comprises dispensing a row of droplets of the viscous material onto the application area with a dispensing apparatus. While moving relative to the substrate along a path proximate the row of droplets, the dispensing apparatus dispenses a fan spray pattern of the viscous material. At least some of the viscous material dispensed in the fan spray pattern impinges and mixes with the row of droplets to define an edge of the fan spray pattern.

15 Claims, 7 Drawing Sheets

METHOD OF CONTROLLING EDGE DEFINITION OF VISCOUS MATERIALS

FIELD OF THE INVENTION

The present invention relates generally to dispensing materials, and more particularly to a method of controlling edge definition of viscous materials applied to an intended application area on a substrate.

BACKGROUND

In the electronics industry, pneumatically actuated "jetting" dispensers are commonly used to selectively dispense small amounts or droplets of a highly viscous material in a non-contact manner onto a substrate or electronic package. Exemplary highly viscous materials include, but are not limited to, solder flux, adhesives, solder paste, solder mask, thermal compounds, oil, encapsulants, potting compounds, inks, conformal coatings, and silicones. Generally, such highly viscous materials cannot easily flow under their own weight at room temperature.

A typical jetting dispenser apparatus includes an air-operated valve element or needle configured to selectively engage a valve seat surrounding a discharge passage. The contact between the valve element and valve seat seals off the discharge passage from a chamber supplied with viscous material under pressure. Thus, to dispense droplets of the viscous material, the valve element is retracted from contact with the valve seat to allow an amount of the viscous material to flow through the newly formed gap and into the discharge passage. The valve element is then moved rapidly toward the valve seat to close the gap, which forces the amount of viscous material through the discharge passage and causes a droplet of the material to be ejected, or "jetted," from an outlet of the discharge passage. The droplet eventually lands on a substrate spaced apart from the dispenser outlet.

Because jetting dispensers do not need to be repositioned in a z-axis direction every time a droplet of the viscous material is ejected, the cycle time between droplets is significantly reduced when compared to other dispensers. Unlike conventional needle dispensers, which rely upon contact between a needle and a surface, jetting dispensers are able to "fly" above the substrate at a fixed height and "jet" the material onto an intended application area without any contact. By rapidly jetting the material "on the fly" (i.e., while the dispenser is in motion), the dispensed droplets may be joined to form a continuous line. Jetting dispensers may therefore be easily programmed to dispense desired patterns of viscous material. This versatility has made jetting dispensers suitable for a wide variety of applications in the microelectronics industry.

For example, jetting dispensers are commonly used to selectively apply solder flux in flip-chip applications. Flip chip assembly typically involves mounting an electronic component, such as a semiconductor die or chip, onto a substrate, such as a printed circuit board. After applying flux to a desired area on the substrate, the chip is mounted such that an active surface having solder "balls" or "bumps" is flipped over and placed in registration with electrical bond pads on the substrate. The solder is then reflowed to create electrical and mechanical interconnections in the form of solder joints extending between the chip and the packaging substrate. During the beginning of the reflow process, the solder flux removes oxide and other surface films of contamination from the substrate and promotes the flowing of the molten solder to form the solder joints.

Frequently, the component to be mounted to the substrate includes an array of solder bumps. To quickly and effectively coat the corresponding bond pad or area on the substrate with solder flux, the jetting dispenser may be modified to apply a thin film or layer of the flux. In particular, the jetting dispenser may be equipped with a nozzle having a coaxial air discharge orifice with the outlet of the discharge passage. The nozzle directs pressurized air through the air discharge orifice to atomize the jetted droplets of flux into smaller particles and to spread the flux into a thin layer on the substrate. Jetting dispensers incorporating such a co-axial air option are therefore capable of covering desired areas with a minimal amount of flux.

Although applying a thin layer of flux in this manner may offer several significant advantages over conventional dipping and screen printing techniques for applying flux, there remain several challenges associated with do so. For example, it can be difficult to obtain good edge definition when applying a layer of solder flux with a jetting dispenser. This challenge is largely a result of the size of the components to which flux is to be applied, the size of the surrounding areas to which flux is not to be applied, the speed of jetting dispensers, and the viscous nature of the flux material.

An example of poor edge definition is generally shown in FIG. 1, which illustrates a printed circuit board 10 after a layer of solder flux 12 has been applied with a jetting dispenser (not shown). The circuit board 10 includes a bond pad 14 with a bump field configured to register with solder bumps (not shown) on an associated chip or other component. Although the area of bond pad 14 is effectively covered with flux 12, overspray in the form of "spider tails" and other errant strands 16 extend beyond a perimeter 18 of the bond pad 14. The errant strands 16 may be a result of atomized particles of flux that rebound outwardly after contacting the circuit board 10 at an angle, amounts of flux being spread across the surface of the circuit board 10 by pressurized air, or a combination of the two. In particular, pressurized air directed around the outlet of the jetting dispenser and the high velocity of droplets ejected from the jetting dispenser may cause some uncontrolled migration as the flux 12 contacts the circuit board 10. This migration makes the final dispensed shape of the flux 12 difficult to control or predict.

The strands 16 may interfere with or contaminate other features or components on the circuit board 10 near the bond pad 14. As a result, secondary cleaning processes may be necessary to remove the overspray or masks may need to be applied to the circuit board 10 before dispensing the flux 12. Both of these options are time-consuming and decrease the overall throughput of the dispensing system. The concerns for poor edge definition may also prompt circuit board and chip designers to arrange components in a manner that sacrifices overall electronic packaging density on the printed circuit board 10.

Therefore, an improved method of applying viscous materials with a jetting dispenser is needed. The method should effectively coat desired areas on a substrate in a manner that reduces the amount of overspray or errant material associated with poor edge definition.

SUMMARY OF THE INVENTION

The embodiments of the invention provide a method of applying viscous material to an application area on a substrate. The method generally comprises dispensing one or more rows of droplets or dots of the material. The rows help serve as a barrier to control the edge definition of viscous material that is subsequently applied to the substrate in a fan spray pattern.

To that end, one method according to the invention comprises dispensing a row of droplets of the viscous material onto an application area with a dispensing apparatus. Then, while moving relative to the substrate along a path proximate the row of droplets, the dispensing apparatus dispenses a fan spray pattern of the viscous material onto the application area proximate the row of droplets. A portion of the viscous material dispensed in the fan spray pattern impinges and mixes with the row of droplets to define an edge of a layer of the viscous material dispensed onto the application area. In one embodiment, the edge of the layer spatially corresponds approximately to an edge of the application area because the row of droplets blocks overspray from the fan spray pattern from migrating outside of the application area.

By virtue of the foregoing, there is thus provided an improved method of applying viscous material to an application area. The method may be particularly useful in the electronics industry where space is typically limited and proper edge definition increases overall reliability and allows for denser packaging of components. For example, the method may be particularly useful when applying solder flux or conformal coatings to a printed circuit board, although other applications are possible. Overall throughput of the dispensing process may be increased because the method reduces or eliminates the need for masking or secondary cleaning processes.

These benefits and other advantages of the invention will be made apparent from the accompanying drawings and the description thereof.

BRIEF DESCRIPTION OF THE DRAWINGS

The accompanying drawings, which are incorporated in and constitute a part of this specification, illustrate exemplary embodiments of the invention and, together with a general description of the invention given above, and the detailed description given below, serve to explain the principles of the invention.

DETAILED DESCRIPTION

Figure 2:
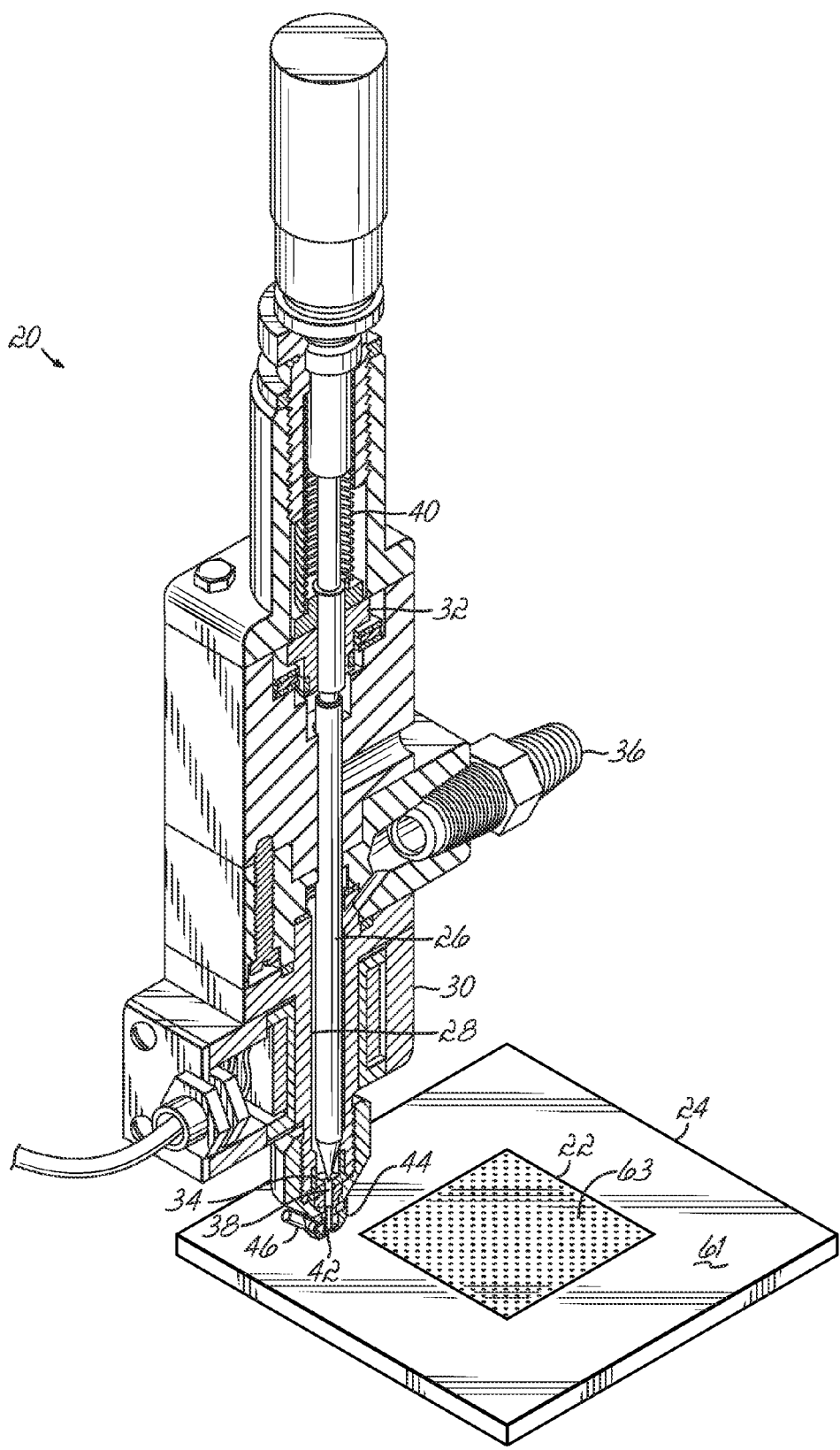
FIG. 2 is a perspective view showing an exemplary dispensing apparatus in partial cross-section and a substrate to which viscous material is to be applied.

FIG. 2 generally illustrates a representative dispensing apparatus 20 that may be used to apply material to an intended application area 22 of a substrate 24 according to the invention. The dispensing apparatus 20 is a noncontact jetting dispenser having an air assist option. The dispensing apparatus 20 may be, for example, a DispenseJet® DJ-2200 commercially available from Asymtek of Carlsbad, Calif. Although the operation of this particular dispensing apparatus will be described herein, those skilled in the art will appreciate that a wide variety of other dispensing apparatuses may be used to complete the method described below. For example, other representative dispensers include those shown and described in U.S. Pat. Nos. 5,320,250, 5,505,777, 5,711,989, and 5,747,102. Additionally, as will be discussed below, more than one dispensing apparatus may be used to apply material to the substrate 24.

The dispensing apparatus 20 includes a housing 30 containing a fluid chamber 28 and a needle 26 configured to reciprocate within the fluid chamber 28. The needle 26 is driven by a plunger or piston 32 sealed off from the fluid chamber 28. More specifically, a solenoid (not shown) is actuated to allow air pressure to pneumatically drive the piston 32 upwardly and retract the needle 26 from a valve seat 34. Viscous material supplied to the fluid chamber 28 through an inlet 36 then flows past the valve seat 34 and into a discharge passage 38 under controlled pressure. After the solenoid exhausts the air pressure acting on the piston 32, a spring 40 returns the needle 26 to the valve seat 34 with an impact force that ejects, or "jets," a droplet or amount of the material in the discharge passage 38 out of an outlet 42 and onto the substrate 24.

The dispensing apparatus 20 also includes an air assist option, which simply refers to any arrangement in which pressurized air complements the dispensing cycle to spread the dispensed droplets into a layer or film on the substrate 24. For example, the dispensing apparatus 20 includes an air assist option in the form of a nozzle 44 configured to direct pressurized air from a passage 46 at or around the outlet 42. In one embodiment, the nozzle 44 directs pressurized air around the outlet 42 in a coaxial manner so that the pressurized air surrounds the jetted droplets or amounts of viscous material. The pressurized air atomizes the dispensed droplets to form a fan spray pattern applied to the substrate 24. As used herein, the term "atomize" simply refers to breaking the dispensed droplets up into a number of smaller particles to form the fan spray pattern. The pressurized air may also help particles of viscous material overcome surface tension and flow into a thin layer covering more area after they contact the substrate 24. It will be appreciated that the pressurized air may be supplied around the outlet 42 in constant manner or in a selective manner that corresponds to the dispensing cycle of the dispensing apparatus 20. For example, in the latter situation, a pulse of pressurized air may follow each droplet of material dispensed from the outlet 42 whenever the air assist option is activated.

Figure 3A:
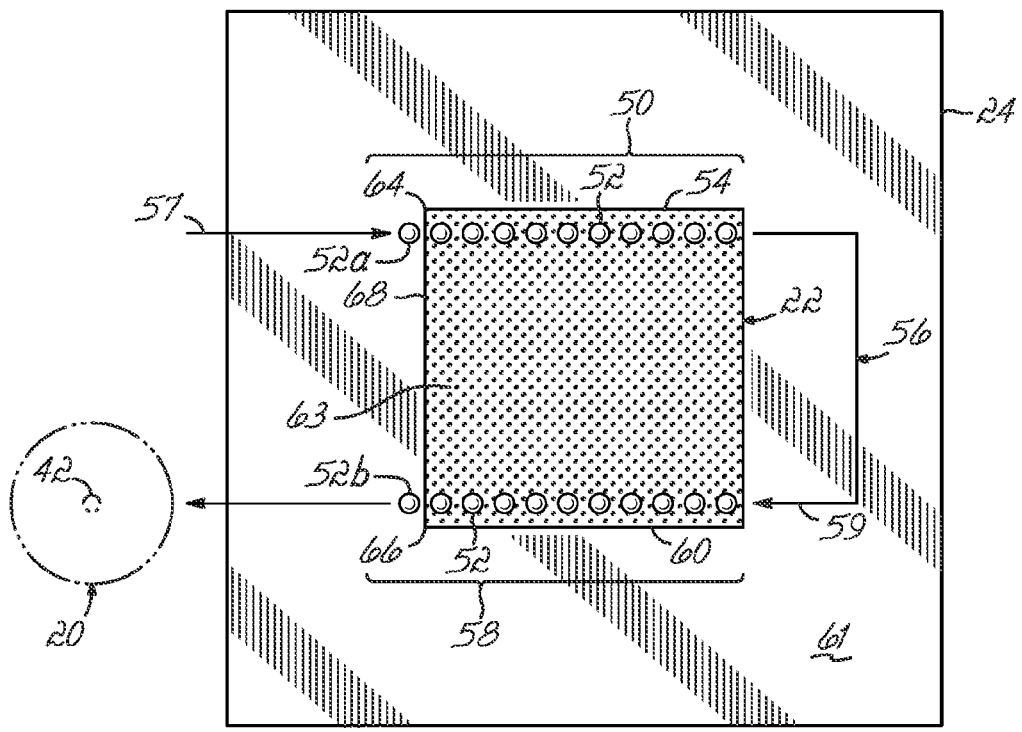
FIGS. 3A-3C are top views schematically illustrating a method of applying viscous material to an intended application area of a substrate.
Figure 3B:
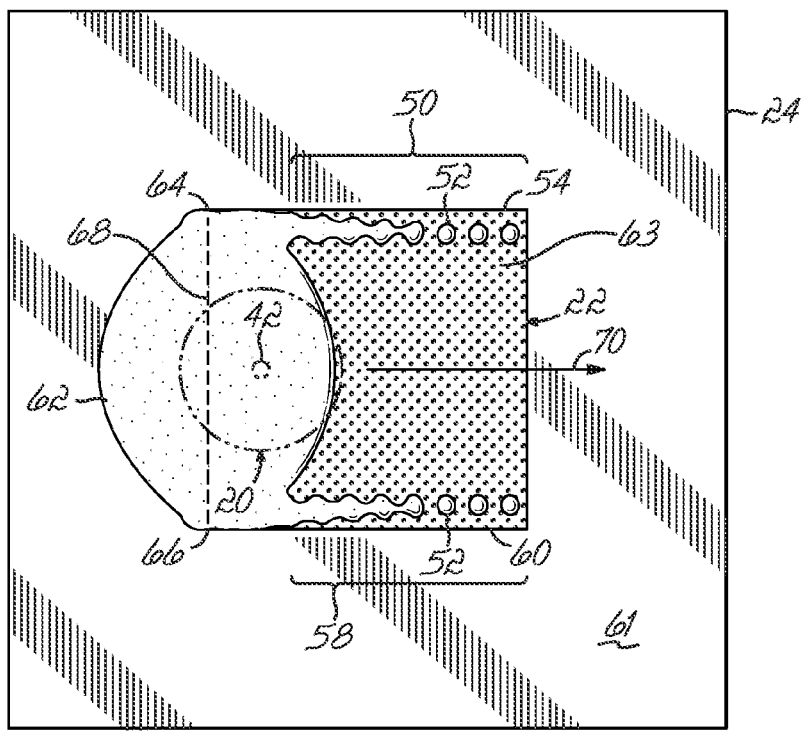
Figure 3C:
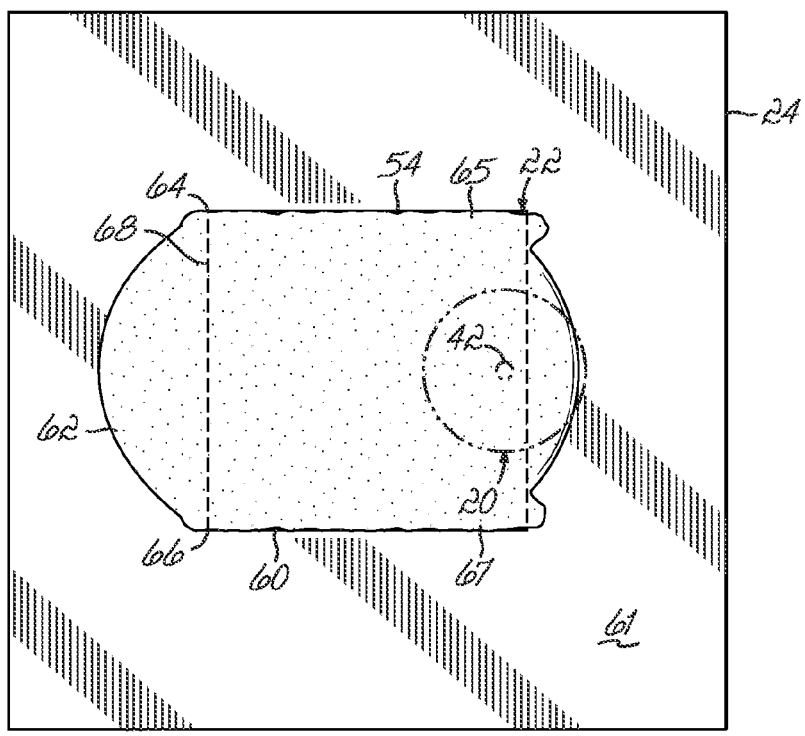

FIGS. 3A-3C schematically illustrate one method of applying viscous material using the dispensing apparatus 20. The method is intended to effectively cover the application area 22 on the substrate 24 with viscous material and may be used for a wide variety of applications. For example, the method may be used to apply solder flux, with the substrate 24 being a printed circuit board and the application area 22 being an electrical bond pad configured to register with the solder bumps (not shown) of a flip chip. The method may also be used to apply conformal coatings to desired areas on a substrate to protect electronic circuitry from harsh environments.

To begin the method, the dispensing apparatus 20 is first positioned above the substrate 24 so that the dispensing outlet 42 does not contact the substrate 24 (see FIG. 2). As shown in FIG. 3A, the apparatus 20 dispenses a first predetermined row 50 of dots or droplets 52 of the viscous material proximate a first edge 54 of the perimeter of the application area 22 as the dispensing apparatus 20 moves relative to the substrate along a preprogrammed path 56. In one specific embodiment, the first row 50 may be formed by the dispensing apparatus 20 alternating between: 1) moving relative to the substrate 24 along a first portion 57 of the path 56, and 2) stopping to dispense one of the droplets 52 of the viscous material. Such a technique may result in the first row 50 being comprised of a series of discrete, spaced apart droplets 52 or a continuous line (not shown) of droplets 52, depending on the distance the dispensing apparatus 20 moves between each dispensing cycle. Dispensing discontinuous droplets 52 conserves the total volume of viscous material required to form the first row 50.

After completing the first row 50, the dispensing apparatus 20 may move along a second portion 59 of the path 56 and dispense a second predetermined row 58 of droplets 52 in the same manner. The second row 58 is formed proximate a second edge 60 substantially parallel to and opposite from the first edge 54. When more than one substrate 24 is fed into the dispensing system in a single batch, or when one substrate includes multiple application areas (not shown), the dispensing apparatus 20 may dispense a first row 50 on each application area 22 to be covered before dispensing any second row 58.

It will be appreciated that either or both of the first and second rows 50, 58 of droplets 52 may alternatively be formed by jetting material "on the fly." Typically, this is accomplished by simultaneously moving the dispensing apparatus 20 relative to the substrate 24 and dispensing droplets 52 of the viscous material. If desired, the velocity of the dispensing apparatus 20 may be slowed as each of the droplets 52 is dispensed. Additionally, the dispensing apparatus 20 may be operated with a very fast dispensing cycle so that consecutive droplets 52 overlap or interconnect when they contact the substrate 24 to form a continuous line.

Still referring to FIG. 3A, the first and second rows 50, 58 of droplets 52 may be spaced apart from the respective first and second edges 54, 60 as shown. In one embodiment, the first and second rows 50, 58 are each spaced away from the respective edges 54, 60 by at least approximately 15% of the distance between the edges 54, 60. In another embodiment, the first and second rows 50, 58 are each spaced away from the respective edges 54, 60 by at least approximately 25% of the distance between the edges 54, 60. The advantages of arranging the first and second rows 50, 58 in this manner will become apparent in light of the discussion below.

After dispensing the first and second rows 50, 58, the dispensing apparatus 20 may be used to cover the remainder of the application area 22 by making one or more passes over the application area 22 with the air assist option activated. During each pass with the air assist option activated, the viscous material is atomized into a fan spray pattern that forms a layer 62 of the viscous material on the substrate 24. The layer 62 (FIGS. 3B and 3C) has a characteristic width at the plane of the substrate 24. But for the presence of the rows 50, 58 of droplets 52, the width may be approximately equal to the separation between the edges 54, 60 if the dispensing apparatus 20 makes a single pass over the application area 22 with the air assist option activated.

Figure 1:
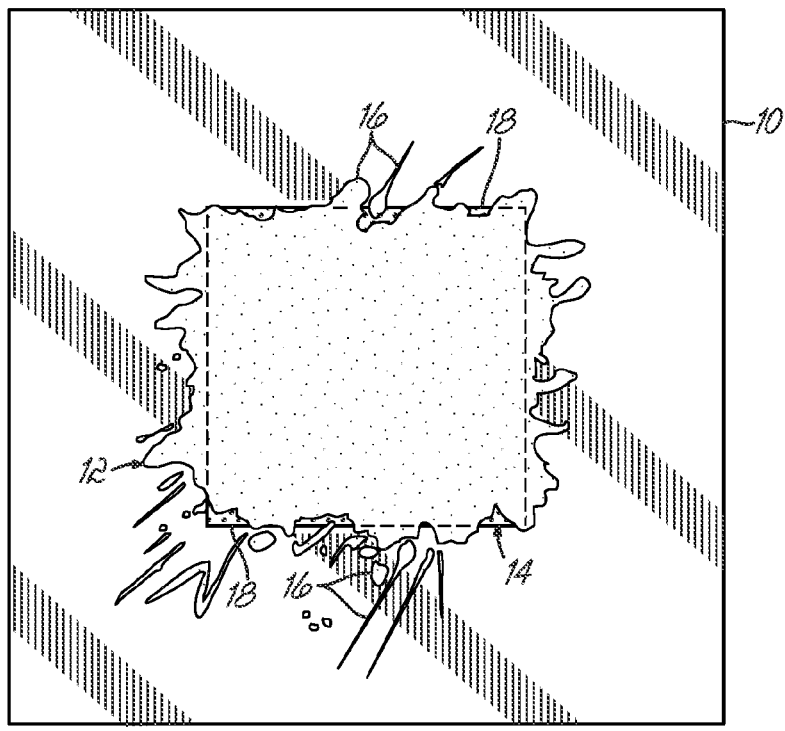
FIG. 1 is top view of a substrate after viscous material has been applied to an intended application area using conventional techniques.
Figure 4:
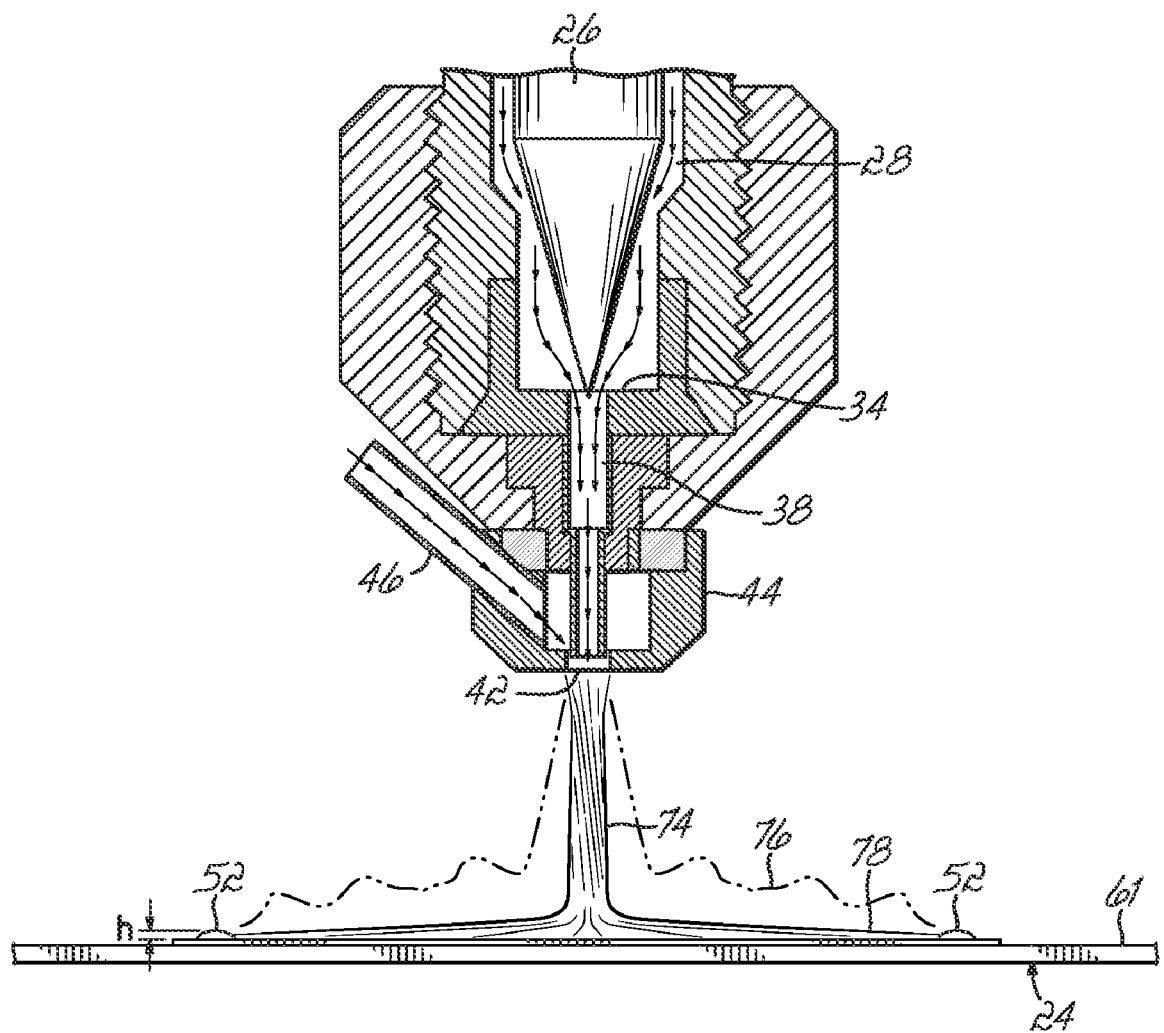
FIG. 4 is an end view showing viscous material being applied to a substrate in a fan spray pattern.
Figure 5A:
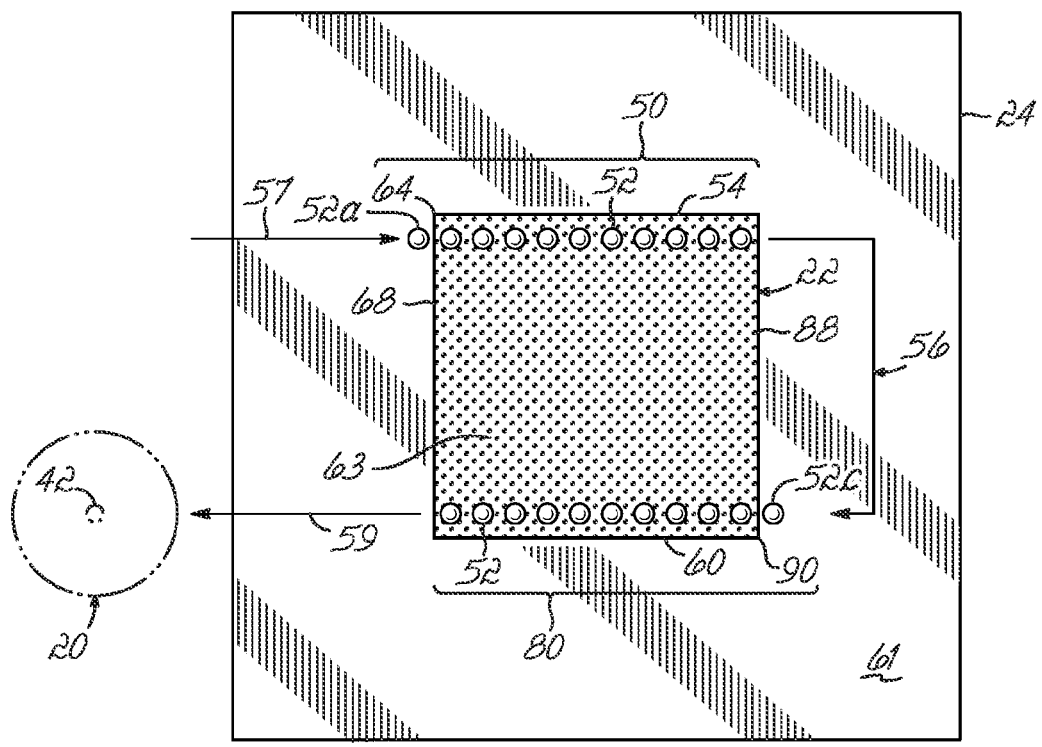
FIGS. 5A-D are top views schematically illustrating an alternative embodiment of a method of applying material to an intended application area of a substrate.
Figure 5B:
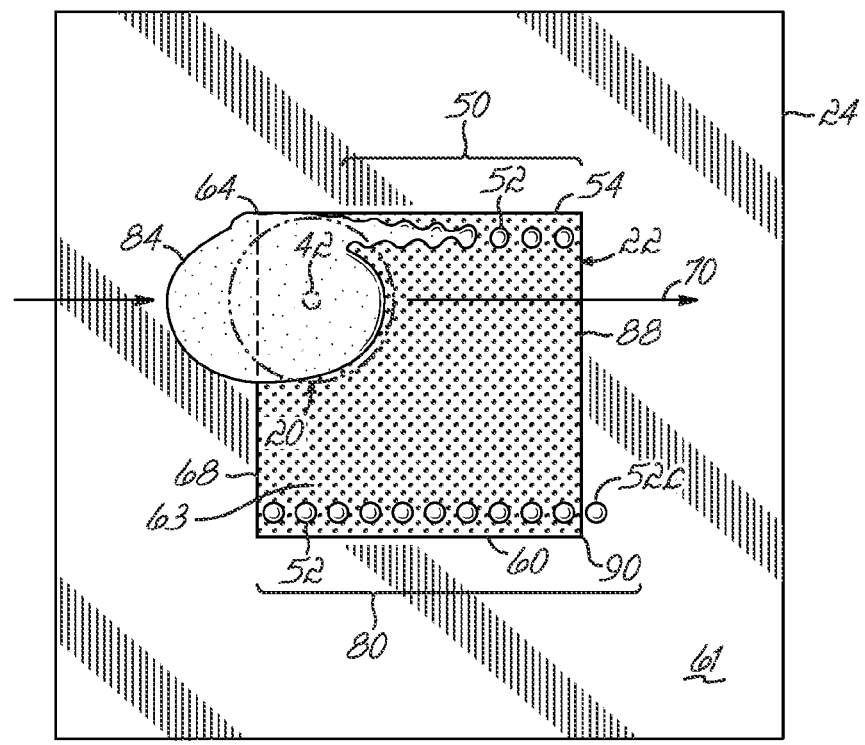
Figure 5C:
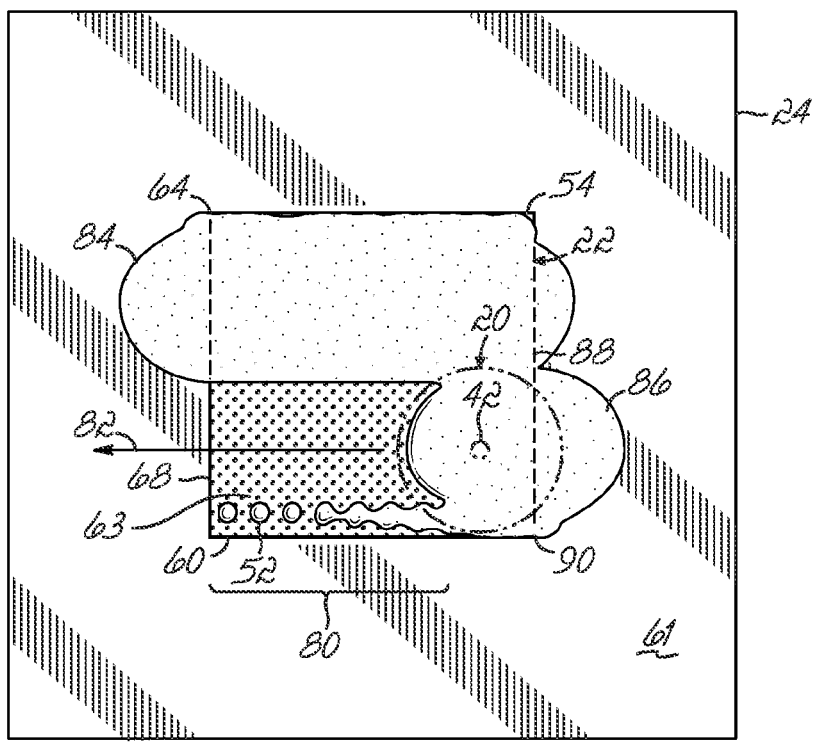
Figure 5D:
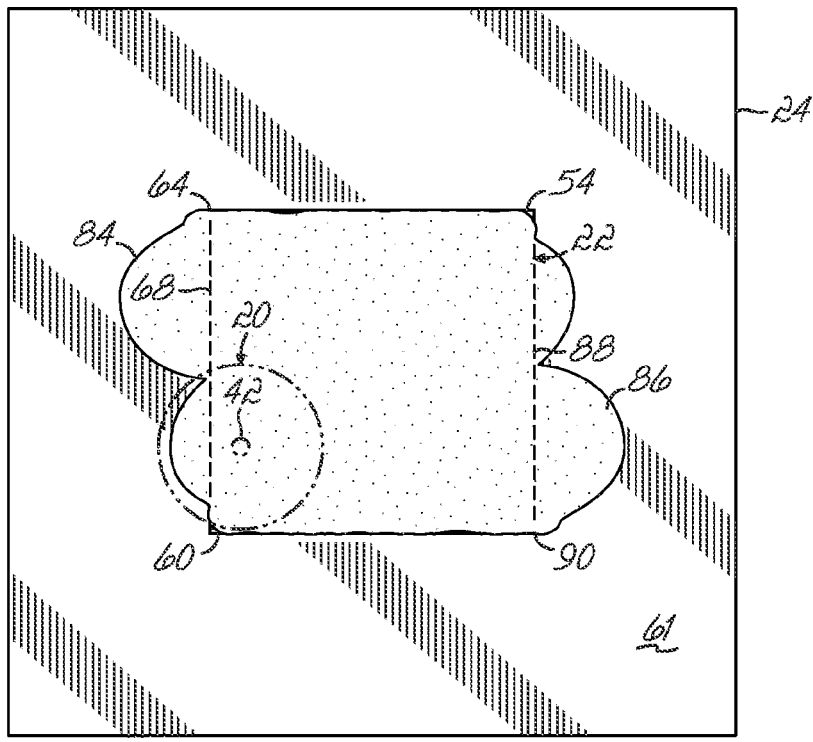

As shown in FIG. 4, the droplets 52 project above a top surface 61 of the substrate 24 with a height, h. The height, h, of the droplets 52 is greater than the height of any features in the application area 22, such as solder bumps of a bump field 63 (FIGS. 3A and 3B). As a result, at least some of the viscous material dispensed in the fan spray pattern—whether it be particles 74 still traveling from the dispensing outlet 42 to the substrate 24, particles 76 that have contacted the substrate 24 and rebounded or roll on the top surface 61, or particles 78 that are being spread across the application area 22 by pressurized air to coalesce and form layer 62—impinges the droplets 52, which effectively bound the final dispensed shape of the fan spray pattern. The droplets 52 collect and mix with this impinging viscous material to ultimately define an edge of the fan spray pattern. Thus, the first and second rows 50, 58 of droplets 52 serve as a barrier and help prevent any migrating material from forming "spider tails" and errant strands 16 (FIG. 1) extending beyond the edges 54, 60 of application area 22, unlike the conventional dispensing techniques discussed above with reference to FIG. 1.

FIGS. 3B and 3C show the dispensing apparatus 20 making a single pass between the first and second rows 50, 58 to cover the application area 22 with layer 62. In one embodiment, the atomized viscous material dispensed in the fan spray pattern impinges the first and second rows 50, 58 of droplets 52 with sufficient kinetic energy to shift the rows 50, 58 toward the respective first and second edges 54, 60. As a result, by the time the dispensing apparatus 20 completes the pass over the application area 22, the droplets 52 coalesce and are mixed with the layer 62 to define first and second edges 65, 67 of the desired final dispensed shape. The edges 65, 67 of the desired final dispensed shape of layer 62 may spatially correspond approximately to the first and second edges 54, 60 of the application area 22. The registration between the edges 65, 67 and edges 54, 60 is beneficial in that substantially the entire surface area of application area 22 is covered by the layer 62 without extending outside of the perimeter of application area 22 along the edges 54, 60.

The movement of the dispensing apparatus 20 across the application area 22 and the pressurized air helping form the layer 62 may cause the first and second rows 50, 58 to shift in the direction 70 of motion of the dispensing apparatus 20. More specifically, the pressurized air directed around the dispensing outlet 42 contacts the substrate 24 and then extends outwardly across the top surface 61 in all directions, including the direction 70. This air may cause the droplets 52 to shift before they mix with any of the material dispensed in the fan spray pattern. To ensure that corners 64, 66 of the application area 22 are effectively covered with the desired edge definition, at least one droplet 52 in each row 50, 58 may be applied outside the application area 22. For example, FIG. 3A illustrates a first droplet 52a in the first row 50 and a first droplet 52b in the second row 58 being applied before the rows 50, 58 cross a leading side edge 68 of the application area 22. The first and second rows 50, 58 are therefore laterally offset opposite to the direction 70 in which the dispensing apparatus 20 will be traveling when making the pass with the air assist option activated. As the dispensing apparatus 20 passes over the application area 22 (FIG. 3B), the pressurized air extending across the substrate 24 shifts the droplets 52 immediately in front of the layer 62 in the direction 70 so as to interconnect with adjacent droplets 52 and form the barrier that controls edge definition.

By the time the dispensing apparatus 20 has completed the pass with the air assist option activated (FIG. 3C), viscous material of the layer 62 covers the application area 22 with little overspray. As a result of this ability to control edge definition, components on the substrate 24 may be placed closer together to allow for dense electronic packaging. Additionally, minimizing overspray improves final product reliability because there is less viscous material extending outside the application area 22 to interfere with other features or components on the substrate. Overall throughput may also be increased because proper edge definition reduces the need for time-consuming preventive steps, such as masking, or expensive secondary cleaning processes.

The method described above may be accomplished in a number of alternative ways to achieve substantially the same results. For example, if desired, two dispensing apparatuses (not shown) may be used to cover the application area 22 with viscous material—a first dispensing apparatus similar to dispensing apparatus 20 could be used to dispense the first and second rows 50, 58 of droplets 52 and a second dispensing apparatus also similar to dispensing apparatus 20 could be used to apply the layer 62 of viscous material with the air assist option activated. To that end, the first and second rows of droplets 50, 58 and the layer 62 need not necessarily be formed from the same materials.

Furthermore, when two or more application areas on a substrate are to be coated, the order in which the viscous material is applied may be varied. For example, in some cases it may be desirable to apply the rows of droplets to all of the application areas before making any passes with the air assist option activated. In other cases it may be desirable to coat the areas one at a time by applying the rows of droplets and filling each area before moving to the next area to be covered. The same holds true when applying material to application areas on different substrates that are fed into the same dispensing system in a single batch.

FIGS. 5A-5D schematically illustrate another method of applying viscous material to the application area 22 of the substrate 24 using the dispensing apparatus 20. Instead of making a single pass over the application area 22 with the air assist option activated, the dispensing apparatus 20 is moved to make two successive passes to fill the application area 22. Multiple passes may be necessary when the intended application area 22 to be covered is relatively large.

The same principles that were discussed above with reference to FIGS. 3A-3C apply when using this method to cover the application area 22 with viscous material. In particular, the dispensing apparatus 20 dispenses the droplets 52 while moving along the first portion 57 of path 56 to form the first predetermined row 50. The dispensing apparatus 20 then moves along the second portion 59 of path 56 to dispense a second predetermined row 80 of droplets 52. After forming the rows 50, 80, the dispensing apparatus 20 makes a first pass proximate the first row 50 in the direction 70 with the air assist option activated. As the dispensing apparatus 20 moves across the application area 22 and dispenses atomized viscous material in the fan spray pattern to form a layer 84, at least some of the atomized viscous material impinges the first row 50 of droplets 52. The first row 50 of droplets 52 acts as a barrier to prevent migrating material from creating overspray in the form of errant strands 16 (FIG. 1) that extend beyond the first edge 54. Additionally, the first row 50 of droplets 52 shifts toward the first edge 54 and mixes with the atomized viscous material to define an edge 92 of the layer 84. The layer 84 also spreads toward the center of the application area 22 during this pass.

To make the second pass, the dispensing apparatus 20 simply shifts toward the edge 60 and second row 80 and then moves along a path proximate the second row 80 in a direction 82 with the air assist option activated. The second row 80 forms a barrier as well to help prevent material from extending beyond the second edge 60 as the dispensing apparatus applies a layer 86. The atomized viscous material forming the layer 86 impinges and mixes with the second row 80 to shift the row 80 toward the second edge 60 and ultimately define a boundary of the applied material. The layer 86 also spreads over the application area 22 in an opposite direction to mix with the layer 84 and effectively coat the application area 22.

Because the dispensing apparatus 20 makes passes over the application area 22 from different directions, the first and second rows 50, 80 are offset in opposite directions 70, 82. More specifically, each row 50, 80 includes at least one droplet 52 outside the application area 22 in the direction from which the dispensing apparatus 20 travels when making the pass proximate the row. The droplet 52a in first row 50 is therefore offset from the leading side edge 68 of the application area 22 and a droplet 52c in the second row 80 are offset from an opposed trailing side edge 88. Such an arrangement helps ensure that dispensed material covers corners 64 and 90. It will be appreciated that instead of making passes from opposite directions 70, 82, the dispensing apparatus 20 may be programmed shift back toward the edge 68 after making the first pass so that the second pass can be made in the same direction 70 as the first pass but proximate to the second row 80. In such a situation, both the first and second rows 50, 80 of droplets 52 may be offset in from the leading side edge 68 like the embodiment shown in FIG. 3A.

Figure 6:
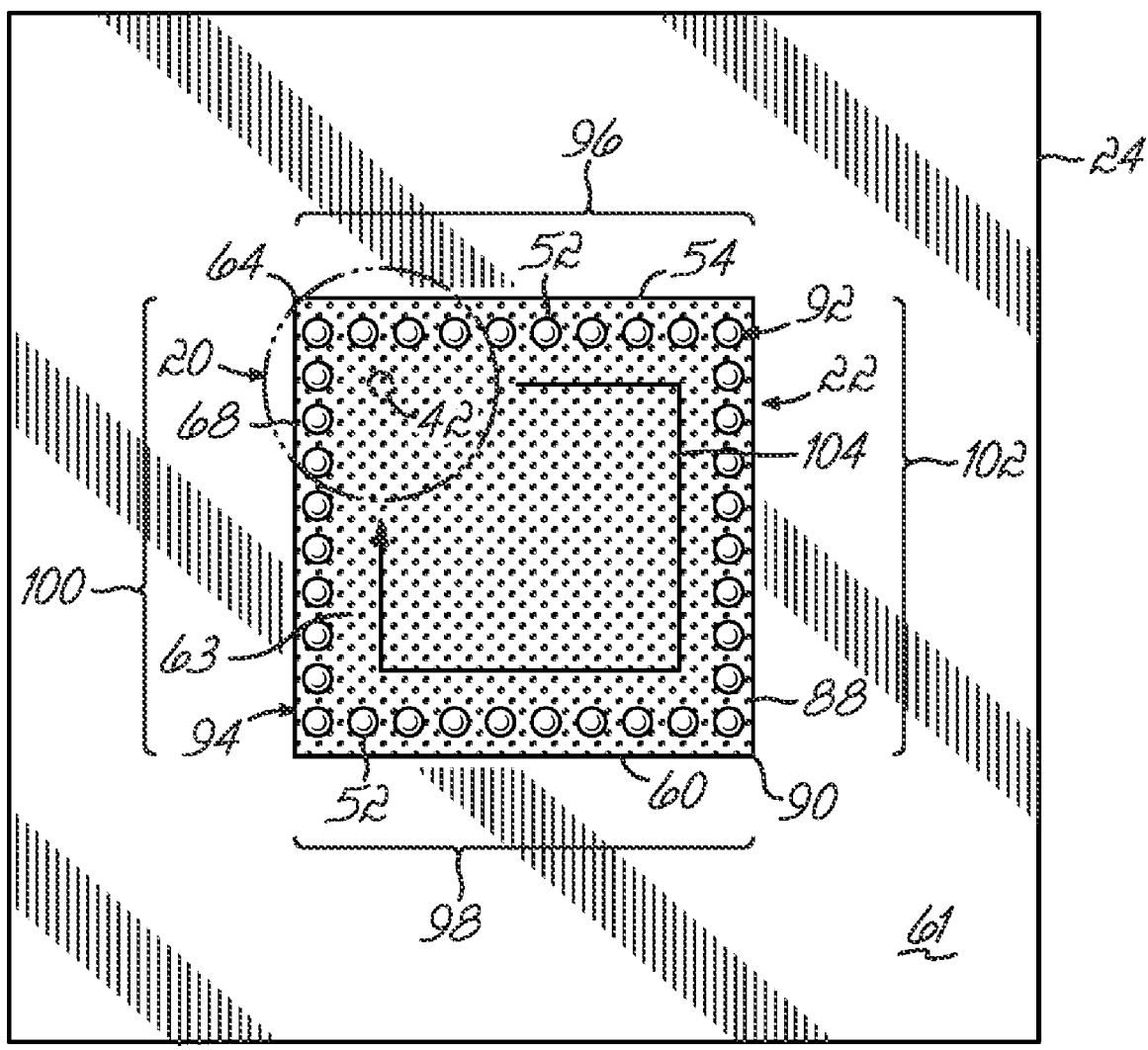
FIG. 6 is a top view of another method of applying viscous material to an intended application area of a substrate.

With reference to FIG. 6, another method of applying viscous material to the application area 22 of the substrate 24 involves dispensing a perimeter 92 of droplets 52 with the dispensing apparatus 20 so as to form a rectangular pattern. Because the method is similar to those discussed above with reference to FIGS. 3A-3C and 5A-5D, only one representative view of the method is shown in FIG. 6. The perimeter 90 may be formed by moving the dispensing apparatus 20 relative to the substrate 24 along a path spaced inwardly from the perimeter 94 of the application area 22, which is defined by the edges 54, 60, 68, 88, and dispensing droplets 52 in rows 96, 98, 100, 102. Alternatively, the perimeter 92 may be formed by dispensing opposed first and second rows 96, 98 of droplets 52 before dispensing opposed third and fourth rows 100, 102 of droplets 52. The rows 96, 98, 100, 102 of droplets 52 define the perimeter 92, and those skilled in the art will appreciate that the rows 96, 98, 100, 102 may be dispensed in any order.

After the perimeter 92 of droplets 52 is formed, the dispensing apparatus 20 then moves along a path 104 with the air assist option activated to dispense viscous material in the fan spray pattern. The path 104 may be spaced inwardly from the perimeter 92 and, thus, be rectangular in nature as well. The viscous material that contacts the application area 22 forms a layer, which is not shown but is similar to layer 62 (FIGS. 3B, 3C), that covers the area within the perimeter 92. Similar to the other methods discussed above, at least some of the viscous material impinges and mixes with the rows 96, 98, 100, 102, which act as a barrier to prevent migrating material from creating overspray that extends substantially beyond the perimeter 94 of application area 22. The rows 96, 98, 100, 102 also shift outwardly toward the perimeter 94 of the application area 22 as they mix with the viscous material dispensed in the fan spray to define an edge of the layer. After the dispensing apparatus 20 completes its movement along the path 104, the edges of the layer substantially coincide with the perimeter 94 such that the substrate 24 is covered with little overspray outside of the application area 22.

While the invention has been illustrated by the description of one or more embodiments thereof, and while the embodiments have been described in considerable detail, they are not intended to restrict or in any way limit the scope of the appended claims to such detail. Additional advantages and modifications will readily appear to those skilled in the art. For example, the invention may be used to apply layers of viscous material, like layer 62, to multiple application areas, like application area 22, on a single substrate, or to apply a layer of viscous material to a single application area on each of multiple substrates in a batch or group. The invention in its broader aspects is therefore not limited to the specific details, representative apparatus and methods and illustrative examples shown and described. Accordingly, departures may be made from such details without departing from the scope or spirit of Applicants'general inventive concept.

What is claimed is:

1. A method of applying material with a dispensing apparatus to an application area on a substrate, the method comprising:
dispensing first and second rows of droplets of the material onto the application area in a first mode of operation of the dispensing apparatus wherein unatomized droplets of material are applied to the application area by the dispensing apparatus;
moving the dispensing apparatus relative to the substrate along a path between the first and second rows of droplets;
dispensing the material from the moving dispensing apparatus in a second mode of operation of the dispensing apparatus wherein droplets of material atomized by air are applied to the application area by the dispensing apparatus between the first and second rows of droplets; and
impinging at least one of the first and second rows of droplets with at least some of the material dispensed in the second mode so that the droplets of the at least one of the first and second rows mix with at least some of the material dispensed in the second mode to define an edge.

2. The method of claim 1 wherein the dispensing apparatus has a dispensing outlet, and dispensing the material from the moving dispensing apparatus in the second mode of operation of the dispensing apparatus wherein droplets of material atomized by air are applied to the application area by the dispensing apparatus between the first and second rows of droplets comprises:
dispensing discrete amounts of the material from the dispensing outlet; and
directing pressurized air around the dispensing outlet in a coaxial manner to atomize the discrete amounts of the material.

3. The method of claim 2 wherein the pressurized air directed around the dispensing outlet in a co-axial manner impacts the substrate and extends across the application area, and wherein dispensing the material further comprises:
impinging the first row of droplets with the pressurized air so as to cause the droplets to shift in a direction of motion of the dispensing apparatus and coalesce to form a barrier.

4. The method of claim 1 wherein the dispensing apparatus has a dispensing outlet, and dispensing first and second rows of droplets of the material onto the application area in the first mode of operation of the dispensing apparatus wherein unatomized droplets of material are applied to the application area by the dispensing apparatus comprises:
dispensing discrete amounts of the material from the dispensing outlet; and
directing pulses of the pressurized air around the dispensing outlet after each discrete amount of the material is dispensed therefrom.

5. The method of claim 1 wherein dispensing the first row of droplets comprises:
dispensing at least two droplets of the material in contact with each other on the application area to form a continuous line of droplets.

6. The method of claim 1 wherein the first application area is a bump field, and dispensing the first row of droplets further comprises:
dispensing an amount of the material in each of the droplets such that each of the droplets projects above the substrate by a greater height than bumps in the bump field.

7. The method of claim 1 wherein moving the dispensing apparatus relative to the substrate along a path between the first and second rows of droplets further comprises:
moving the dispensing apparatus along a first portion of the path proximate the first row of droplets to make a first pass over the application area; and
moving the dispensing apparatus along a second portion of the path proximate the second row of droplets to make a second pass over the application area.

8. The method of claim 1 wherein the first and second rows of droplets are spaced inwardly from respective first and second edges of the application area, and wherein impinging at least one of the first and second rows with at least some of the material dispensed further comprises:
shifting the at least one of the first and second rows outwardly toward the corresponding one of the first and second edges of the application area.

9. The method of claim 1 wherein the dispensing apparatus has a dispensing outlet, and dispensing the material from the moving dispensing apparatus in the second mode of operation of the dispensing apparatus further comprises:
dispensing discrete amounts of the material from the dispensing outlet; and
directing pressurized air around the dispensing outlet in a coaxial manner to atomize the discrete amounts of the material.

10. The method of claim 9 wherein directing pressurized air around the dispensing outlet further comprises:
directing pulses of the pressurized air around the dispensing outlet after each discrete amount of the material is dispensed therefrom.

11. The method of claim 1 wherein the dispensing apparatus has a dispensing outlet, and wherein while dispensing first and second rows of droplets of the material onto the application area in the first mode of operation of the dispensing apparatus, pressurized air is directed from the dispensing apparatus onto at least some of the droplets in the first and second rows of droplets to flatten at least some of the droplets in the first and second rows of droplets.

12. The method of claim 11 wherein the pressurized air is provided around the dispensing outlet in a coaxial manner to impinge upon at least some of the droplets in the first and second rows of droplets to flatten the droplets.

13. A method of applying material to an application area on a substrate, the method comprising:
dispensing first and second rows of unatomized droplets of the material onto the application area with a first dispensing apparatus;
moving a second dispensing apparatus relative to the substrate along a path between the first and second rows of unatomized droplets;
dispensing the material from the moving second dispensing apparatus as air atomized material between the first and second rows of unatomized droplets; and
impinging at least one of the first and second rows of unatomized droplets with at least some of the air atomized material dispensed so that the unatomized droplets mix with the air atomized material dispensed by the second dispensing apparatus to define an edge.

14. The method of claim 13 wherein the second dispensing apparatus has a dispensing outlet, and dispensing the material from the moving second dispensing apparatus as air atomized material between the first and second rows of unatomized droplets comprises:

dispensing discrete amounts of the material from the dispensing outlet; and directing pressurized air around the dispensing outlet in a coaxial manner to atomize the discrete amounts of the material.

15. The method of claim 13 wherein said first dispensing apparatus directs directing pressurized air to impinge upon at least some of the unatomized droplets of the first and second rows of unatomized droplets to flatten at least some of the unatomized droplets in the first and second rows of unatomized droplets.

* * * * *

UNITED STATES PATENT AND TRADEMARK OFFICE
CERTIFICATE OF CORRECTION

PATENT NO. : 7,785,667 B2  Page 1 of 1
APPLICATION NO. : 11/619871
DATED : August 31, 2010
INVENTOR(S) : Horatio Quinones It is certified that error appears in the above-identified patent and that said Letters Patent is hereby corrected as shown below:

Column 12, Line 2, Claim 15, after "directs", delete "directing".

Signed and Sealed this

Sixteenth Day of November, 2010

David J. Kappos
*Director of the United States Patent and Trademark Office*